US008839083B2

(12) United States Patent
Kim et al.

(10) Patent No.: US 8,839,083 B2
(45) Date of Patent: Sep. 16, 2014

(54) SECURE ERROR DETECTION AND SYNCHRONOUS DATA TAGGING FOR HIGH-SPEED DATA TRANSFER

(75) Inventors: Moon J. Kim, Wappingers Falls, NY (US); Dong I. Shin, Seoul (KR)

(73) Assignee: Taejin Info Tech Co., Ltd., Seoul (KR)

( * ) Notice: Subject to any disclaimer, the term of this patent is extended or adjusted under 35 U.S.C. 154(b) by 108 days.

(21) Appl. No.: 13/280,621

(22) Filed: Oct. 25, 2011

(65) Prior Publication Data
US 2013/0104011 A1 Apr. 25, 2013

(51) Int. Cl.
G06F 11/00 (2006.01)
G06F 11/10 (2006.01)
H03M 13/09 (2006.01)

(52) U.S. Cl.
CPC .............. *G06F 11/10* (2013.01); *H03M 13/09* (2013.01)
USPC ............................ 714/799; 714/763; 714/798

(58) Field of Classification Search
CPC . G06F 11/10; G06F 11/1008; G06F 11/1076; G06F 11/1068; G06F 11/1044; H04L 1/0061; H04L 1/0045; G11C 7/1006
USPC ................. 714/770, 758, 786, 799, 763, 798; 713/160, 161, 765; 726/27, 28; 360/26, 360/36.1, 47, 53; 365/200, 201
See application file for complete search history.

(56) References Cited

U.S. PATENT DOCUMENTS 5,948,117 A * 9/1999 Weng et al. .................... 714/784
8,219,882 B2 * 7/2012 Tamura et al. ................. 714/763
2004/0064626 A1 * 4/2004 Shah et al. ..................... 710/310
2005/0055522 A1 * 3/2005 Yagi .............................. 711/163
2006/0034452 A1 * 2/2006 Tonomura et al. ............. 380/28
2008/0076357 A1 * 3/2008 Chen et al. ..................... 455/63.1
2008/0092025 A1 * 4/2008 Hedayat et al. ................ 714/792
2009/0119432 A1 * 5/2009 Lee et al. ....................... 710/113
2009/0310408 A1 * 12/2009 Lee et al. ................. 365/185.03
2010/0023800 A1 * 1/2010 Harari et al. .................... 714/2
2011/0041005 A1 * 2/2011 Selinger .......................... 714/6
2011/0066910 A1 * 3/2011 Bandholz et al. ............. 714/748
2011/0261618 A1 * 10/2011 Cornwell et al. ......... 365/185.03
2011/0286534 A1 * 11/2011 Hatakeyama ................. 375/257
2011/0320881 A1 * 12/2011 Dodson et al. ................. 714/43

FOREIGN PATENT DOCUMENTS

JP 2007-058873 A 3/2007
KR 10-2006-0085172 A 7/2006

OTHER PUBLICATIONS

Office Action dated Jan. 7, 2014 in Korean Application No. 10-2012-0119247.

* cited by examiner

*Primary Examiner* — Albert Decady
*Assistant Examiner* — Osman Alshack
(74) *Attorney, Agent, or Firm* — Saliwanchik, Lloyd & Eisenschenk

(57) ABSTRACT

Embodiments of the present invention provide a system for secure error detection and synchronous data tagging for high-speed data transfer (e.g., utilizing a set of SSD memory disk units). Specifically, in a typical embodiment, the system comprises a SSD memory disk unit in communication with a device driver. A first encoded communication stream will be generated with the device driver and sent via PCI-based channel (e.g., full duplex) to the SSD memory disk unit. The stream is received, synchronized, and decoded on the SSD memory disk unit. In turn, the SSD memory disk unit can generate and send a second encoded communication steam to the device driver.

20 Claims, 3 Drawing Sheets

US 8,839,083 B2

SECURE ERROR DETECTION AND SYNCHRONOUS DATA TAGGING FOR HIGH-SPEED DATA TRANSFER

CROSS-REFERENCE TO RELATED APPLICATION

This application is related in some aspects to commonly-owned, co-pending application Ser. No. 12/758,937, entitled "SEMICONDUCTOR STORAGE DEVICE", filed on Apr. 13, 2010, the entire contents of which are herein incorporated by reference. This application is related in some aspects to commonly-owned, co-pending application Ser. No. 13/229,957, entitled "SEMICONDUCTOR STORAGE DEVICE HAVING MULTIPLE HOST INTERFACE UNITS FOR INCREASED BANDWIDTH", filed on Sep. 12, 2011, the entire contents of which are herein incorporated by reference.

FIELD OF THE INVENTION

The present invention relates to a semiconductor storage device (SSD) of a PCI-Express (PCI-e) type. Specifically, the present invention relates to secure error detection and synchronous data tagging for high-speed data transfer.

BACKGROUND OF THE INVENTION

As the need for more computer storage grows, more efficient solutions are being sought. As is known, there are various hard disk solutions that store/read data in a mechanical manner as a data storage medium. Unfortunately, data processing speed associated with hard disks is often slow. Moreover, existing solutions still use interfaces that cannot catch up with the data processing speed of memory disks having high-speed data input/output performance as an interface between the data storage medium and the host. Therefore, there is a problem in the existing area in that the performance of the memory disk cannot be property utilized.

SUMMARY OF THE INVENTION

Embodiments of the present invention provide a system for secure error detection and synchronous data tagging for high-speed data transfer (e.g., utilizing a set of SSD memory disk units). Specifically, in a typical embodiment, the system comprises a SSD memory disk unit in communication with a device driver. A first encoded communication stream will be generated with the device driver and sent via aPCI-based channel (e.g., full duplex) to the SSD memory disk unit. The first encoded communication stream comprises a first tag having an error detection code (EDC), a data portion, and a second tag having a data protection code (DPC). The stream is received, synchronized, and decoded on the SSD memory disk unit. In turn, the SSD memory disk unit can generate and send a second encoded communication stream to the device driver. Similar to the first encoded communication stream, the second encoded communication stream comprises a first tag having an error detection code (EDC), a data portion, and a second tag having a data protection code (DPC). Upon receipt, the device driver will synchronize and decode the same.

A first aspect of the present invention provides a system for secure error detection and synchronous data tagging for high-speed data transfer, comprising: a device driver being configured generating a first encoded communication stream, the first encoded communication stream comprising a first tag having an error detection code (EDC), a data portion, and a second tag having a data protection code (DPC); and a semiconductor storage device (SSD) memory disk unit being configured to receive and decode the first encoded communication stream.

A second aspect of the present invention provides a system for secure error detection and synchronous data tagging for high-speed data transfer, comprising: a device driver being configured to generate a first encoded communication stream, the device driver comprising: an error detection code (EDC) encoder for encoding a first tag of the first encoded communication stream; a data protection code (DPC) encoder coupled to the EDC encoder for encoding a second tag of the first encoded communication stream; a first physical interface coupled to the DPC encoder for transmitting the first encoded communication stream; a semiconductor storage device (SSD) memory disk unit being configured to receive the first encoded communication stream from the device driver comprising: a first host interface for receiving the first encoded communication stream from the physical interface; a data synchronizer coupled to the host interface for synchronizing data in the first encoded communication stream; an EDC decoder coupled to the data synchronizer for decoding the first tag; and a DPC decoder coupled to the EDC decoder for decoding the second tag.

A third aspect of the present invention provides a method for providing error detection and synchronous data tagging for high-speed data transfer, comprising: generating a first encoded communication stream with a device driver, the first encoded communication stream comprising a first tag having an error detection code (EDC), a data portion, and a second tag having a data protection code (DPC); receiving the first encoded communication stream on a semiconductor storage device (SSD) memory disk unit; and decoding the first encoded communication stream on the SSD memory disk unit.

BRIEF DESCRIPTION OF THE DRAWINGS

These and other features of this invention will be more readily understood from the following detailed description of the various aspects of the invention taken in conjunction with the accompanying drawings in which.

Figure 1:
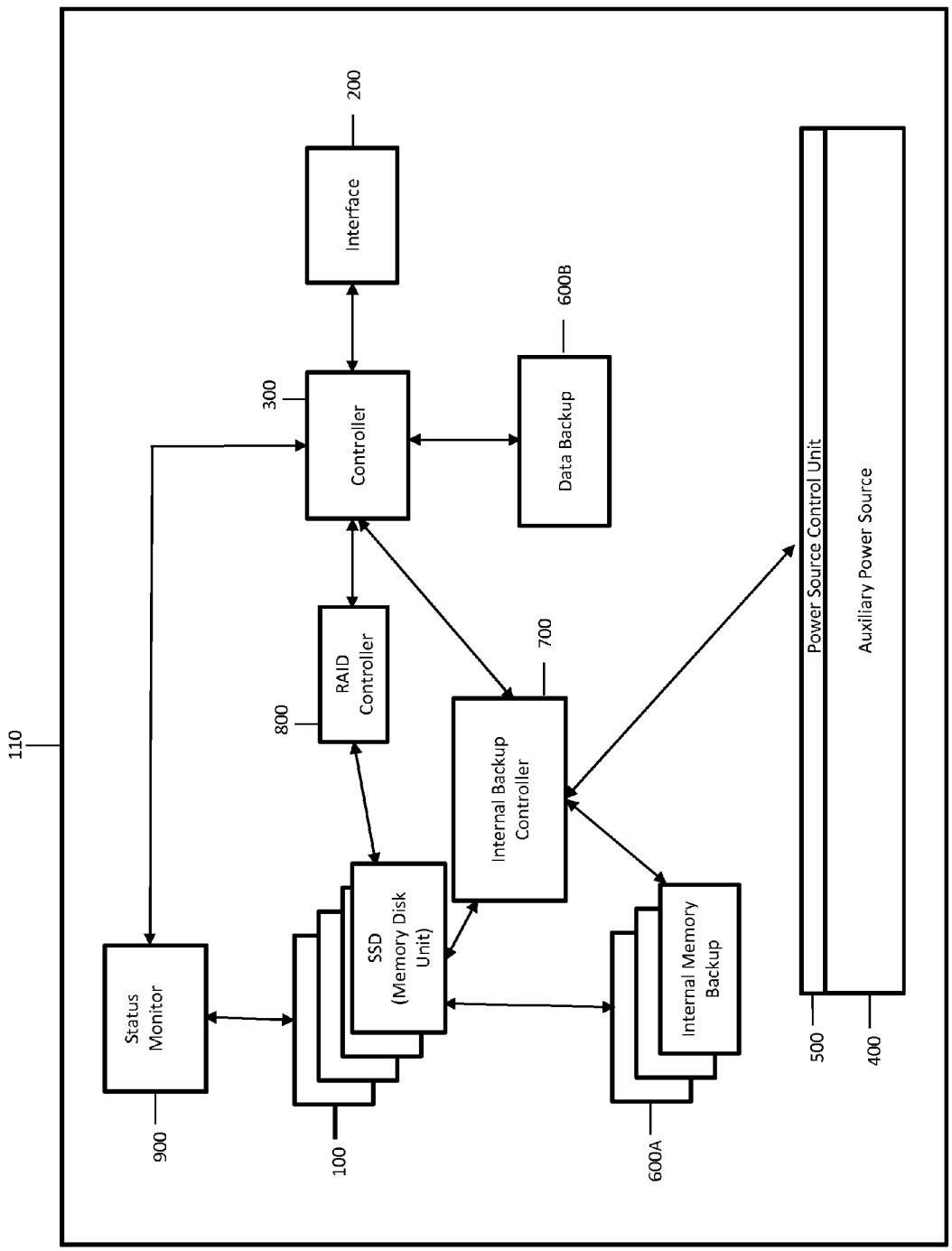
FIG. 1 is a diagram illustrating a configuration of a storage device of a PCI-Express (PCI-e) type according to an embodiment of the present invention.

The drawings are not necessarily to scale. The drawings are merely schematic representations, not intended to portray specific parameters of the invention. The drawings are intended to depict only typical embodiments of the invention, and therefore should not be considered as limiting the scope of the invention. In the drawings, like numbering represents like elements.

DETAILED DESCRIPTION OF THE INVENTION

Exemplary embodiments will now be described more fully herein with reference to the accompanying drawings, in which exemplary embodiments are shown. This disclosure may, however, be embodied in many different forms and should not be construed as limited to the exemplary embodiments set forth therein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

The terminology used herein is for the purpose of describing particular embodiments only and is not intended to be limited to this disclosure. As used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. The term "set" means a quantity of at least one. The term "coupled" can be physical or non physical (e.g., communication-based) coupling. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof. Moreover, as used herein, the term RAID means redundant array of independent disks (originally redundant array of inexpensive disks). In general, RAID technology is a way of storing the same data in different places (thus, redundantly) on multiple hard disks. By placing data on multiple disks, I/O (input/output) operations can overlap in a balanced way, improving performance. Since multiple disks increase the mean time between failures (MTBF), storing data redundantly also increases fault tolerance.

Unless otherwise defined, all terms (including technical and scientific terms) used herein have the same meaning as commonly understood by one of ordinary skill in the art. It will be further understood that terms such as those defined in commonly used dictionaries should be interpreted as having a meaning that is consistent with their meaning in the context of the relevant art and the present disclosure, and will not be interpreted in an idealized or overly formal sense unless expressly so defined herein.

Hereinafter, a storage device of a PCI-Express (PCI-e) type according to an embodiment will be described in detail with reference to the accompanying drawings.

Embodiments of the present invention provide a system for secure error detection and synchronous data tagging for high-speed data transfer (e.g., utilizing a set of SSD memory disk units). Specifically, in a typical embodiment, the system comprises a SSD memory disk unit in communication with a device driver. A first encoded communication stream will be generated with the device driver and sent via PCI-based channel (e.g., full duplex) to the SSD memory disk unit. The first encoded communication stream comprises a first tag having an error detection code (EDC), a data portion, and a second tag having a data protection code (DPC). The stream is received, synchronized, and decoded on the SSD memory disk unit. In turn, the SSD memory disk unit can generate and send a second encoded communication steam to the device driver. Similar to the first encoded communication stream, the second encoded communication stream comprises a first tag having an error detection code (EDC), a data portion, and a second tag having a data protection code (DPC). Upon receipt, the device driver will synchronize and decode the same.

The storage device of a PCI-Express (PCI-e) type supports a low-speed data processing speed for a host by adjusting synchronization of a data signal transmitted/received between the host and a memory disk during data communications between the host and the memory disk through a PCI-Express interface, and simultaneously supports a high-speed data processing speed for the memory disk, thereby supporting the performance of the memory to enable high-speed data processing in an existing interface environment at the maximum. It is understood in advance that although PCI-Express technology will be utilized in a typical embodiment, other alternatives are possible. For example, the present invention could utilize Serial Attached Small Computer System Interface (SAS)/Serial Advanced Technology Advancement (SATA) technology in which a SAS/SATA type storage device is provided that utilizes a SAS/SATA interface Referring now to FIG. 1, a diagram schematically illustrating a configuration of a PCI-Express type, RAID controlled semiconductor storage device (e.g., for providing storage for a serially attached computer device) according to an embodiment of the invention is shown. As depicted, FIG. 1 shows a RAID controlled PCI-Express type storage device 110 according to an embodiment of the invention which includes a SSD memory disk unit 100 (referred to herein as SSD memory disk unit, SSD, and/or SSD memory disk unit) comprising: a plurality of memory disks having a plurality of volatile semiconductor memories/memory units (also referred to herein as high-speed SSD memory disk units 100); a RAID controller 800 coupled to SSD memory disk units 100; an interface unit 200 (e.g., PCI-Express host) which interfaces between the SSD memory disk unit and a host; a controller unit 300; an auxiliary power source unit 400 that is charged to maintain a predetermined power using the power transferred from the host through the PCI-Express host interface unit; a power source control unit 500 that supplies the power transferred from the host through the PCI-Express host interface unit to the controller unit 300, the SSD memory disk units 100, the backup storage unit, and the backup control unit which, when the power transferred from the host through the PCI-Express host interface unit is blocked or an error occurs in the power transferred from the host, receives power from the auxiliary power source unit and supplies the power to the SSD memory disk unit through the controller unit; a backup storage unit 600A-B that stores data of the SSD memory disk unit; and a backup control unit 700 that backs up data stored in the SSD memory disk unit in the backup storage unit, according to an instruction from the host or when an error occurs in the power transmitted from the host; and a redundant array of independent disks (RAID) controller 800 coupled to SSD memory disk unit 100, controller 300, and internal backup controller 700.

The SSD memory disk unit 100 includes a plurality of memory disks provided with a plurality of volatile semiconductor memories for high-speed data input/output (for example, DDR, DDR2, DDR3, SDRAM, and the like), and inputs and outputs data according to the control of the controller 300. The SSD memory disk unit 100 may have a configuration in which the memory disks are arrayed in parallel.

The PCI-Express host interface unit 200 interfaces between a host and the SSD memory disk unit 100. The host may be a computer system or the like, which is provided with a PCI-Express interface and a power source supply device.

The controller unit 300 adjusts synchronization of data signals transmitted/received between the PCI-Express host interface unit 200 and the SSD memory disk unit 100 to control a data transmission/reception speed between the PCI-Express host interface unit 200 and the SSD memory disk unit 100.

As depicted, a PCI-e type RAID controller 800 can be directly coupled to any quantity of SSD memory disk units 100. Among other things, this allows for optimum control of SSD memory disk units 100. Among other things, the use of a RAID controller 800:
1. Supports the current backup/restore operations.
2. Provides additional and improved backup function by performing the following:
   a) the internal backup controller 700 determines the backup (user's request order or the status monitor detects power supply problems);
   b) the internal backup controller 700 requests a data backup to SSD memory disk units;
   c) the internal backup controller 700 requests internal backup device to backup data immediately;
   d) the internal backup controller 700 monitors the status of the backup for the SSD memory disk units and internal backup controller; and
   e) the internal backup controller 700 reports the internal backup controller's status and end-op.
3. Provides additional and improved restore function by performing the following:
   a) the internal backup controller 700 determines the restore (user's request order or the status monitor detects power supply problems);
   b) the internal backup controller 700 requests a data restore to the SSD memory disk units;
   c) the internal backup controller 700 requests an internal backup device to restore data immediately;
   d) the internal backup controller 700 monitors the status of the restore for the SSD memory disk units and internal backup controller; and
   e) the internal backup controller 700 reports the internal backup controller status and end-op.

Figure 2:
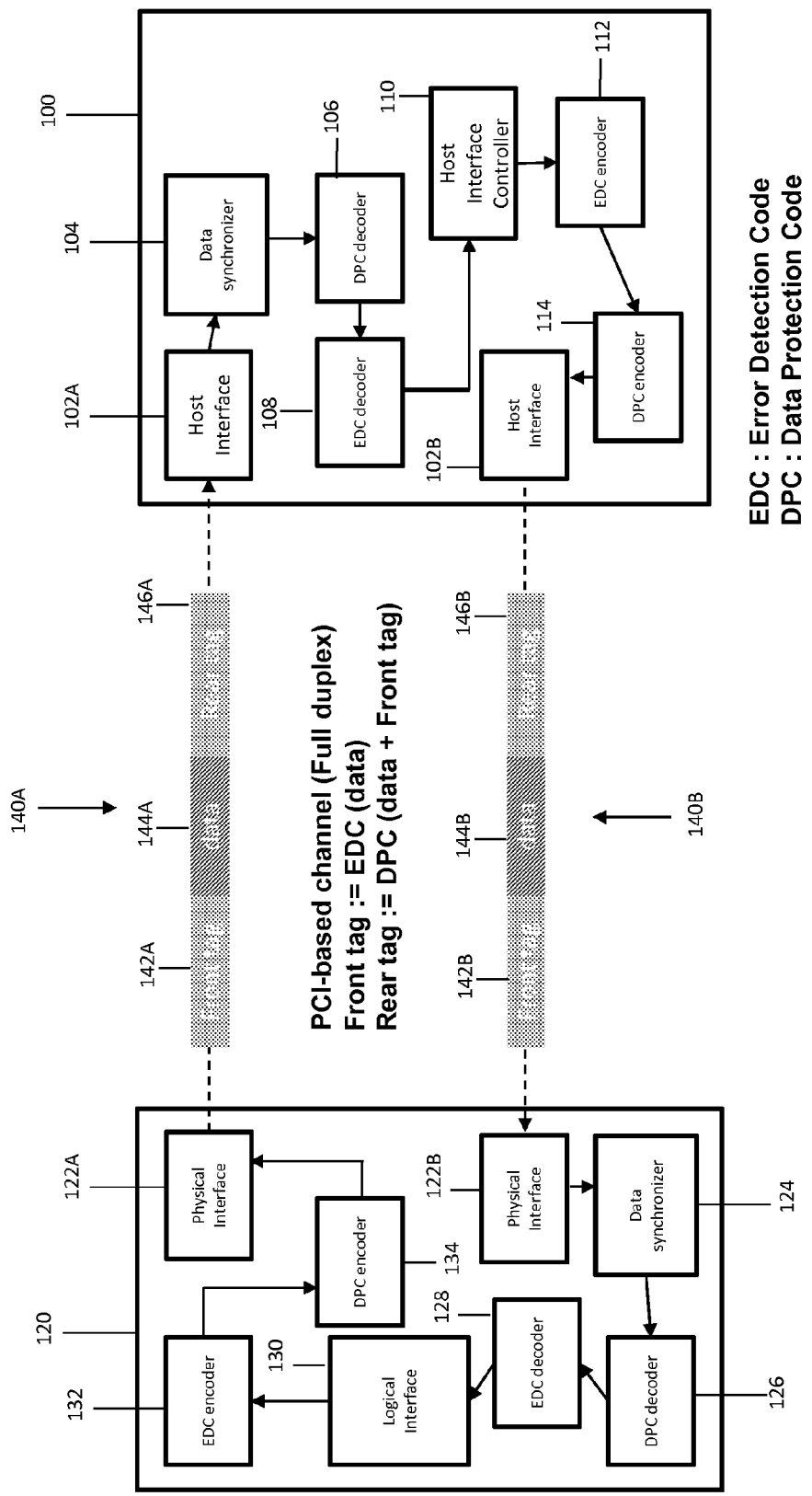
FIG. 2 is a diagram of a high-speed SSD and device driver according to an embodiment of the present invention.

Referring now to FIG. 2, a diagram schematically illustrating a configuration of a high-speed SSD memory disk unit 100 as coupled to a device driver 120 is shown. As depicted, SSD memory disk unit 100 comprises "SSD" components such as: host interfaces 102A-B, data synchronizer 104, data protection ode (DPC) decoder 106, error detection code (EDC) decoder 108, host interface controller 110, EDC encoder 112, and DPC decoder 114. Device driver 120 comprises "device driver" components such as: physical interfaces 122A-B, data synchronizer 124, DPC decoder 126, EDC decoder 128, logical interface 130, DPC encoder 134, and EDC encoder 132.

FIG. 2 further shows two communication streams 140A-B through a PCI-based communication channel (full duplex). As shown, streams 140A-B each comprises front tag 142A-B, data 144A-B and rear tag 146A-B. In general, front tags 142A-B comprise EDCs, while rear tags 146A-B comprise DPCs (e.g., data 144A-B and front tags 142A-B). Referring first to stream 140A sent from device driver 120 to SSD memory disk unit 100. Stream 140A (generated by device driver 120) will be: received by host interface 102A; passed to data synchronizer 104 for data 144A synchronization; passed to DPC decoder 106 where rear tag 146A will be decoded; and passed to EDC decoder 108 where front tag 142A will be decoded. In order to generate stream 140B, data 144B (or other data) can be then passed to host interface controller 110. From there, EDC encoder 112 will generate front tag 142B; DPC encoder 114 will generate rear tag 146A, and host interface will then communicate stream 144B to physical interface 122B.

Stream 140B will be processed similar to stream 140A. Specifically, data synchronizer 124 will synchronize data 144B, DPC decoder 126 will decode rear tag 146B, and EDC decoder 128 will decode front tag 142B. Decoded stream 140B can then be passed to logical interface 130. When generation of stream 140A is desired, EDC encoder 132 will generate front tag 142A for data 144A; DPC encoder 134 will generate rear tag 146A; and physical interface 122A will communicate stream 140A to host interface 102A.

The embodiment shown in FIG. 2 provides multiple features not previously realized. For example, tags 142A-B and 146A-B are inserted to enable data security check, error detection, and completeness of data transfer. As indicated above, front tags 142A-B comprise error-detecting codes designed to detect accidental changes to raw data (e.g., CRC). Rear tags 146A-B comprise data protection codes to protect against intentional modification and creation of data. (e.g., Message Authentication Code). Use of both tags types 142A-B and 146A-B help ensure that data transfer is complete via the FIFO PCI channel. A middle tag can be used for occasional verification. In general, tags 142A-B and 146A-B are inserted selectively depending on the channel condition. More tags may be needed at the beginning of the communication session to check and ensure channel condition. Along these lines, the number of tags can be reduced or increased depending the channel conditions or security checks. For a higher level of security, entire communication contents can be incorporated into the tags.

These features are in contrast to previous approaches in which high-speed data transmission channels relied on outdated mechanisms. As such, previous approaches were: error-prone since the high-speed channel was subject to channel, transceiver, and quantization noise; non-secure and subject to malicious interference and manipulation; and asynchronous:

It is understood that although not shown, SSD memory disk unit 100 can comprise additional elements such as a memory array having one or more blocks of memory, a DMA controller, etc. Along these lines, SSD memory disk unit 100 can further comprise any of the elements and/or their interconnections of the SSD memory disk units discussed in the above-incorporated patent applications. In general, DMA is a feature of modern computers and microprocessors that allows certain hardware subsystems within the computer to access system memory for reading and/or writing independently of the central processing unit. Many hardware systems use DMA including disk drive controllers, graphics cards, network cards, and sound cards. DMA is also used for intra-chip data transfer in multi-core processors, especially in multiprocessor system-on-chips, where its processing element is equipped with a local memory (often called scratchpad memory) and DMA is used for transferring data between the local memory and the main memory. Computers that have DMA channels can transfer data to and from devices with much less CPU overhead than computers without a DMA channel. Similarly, a processing element inside a multi-core processor can transfer data to and from its local memory without occupying its processor time and allowing computation and data transfer concurrency.

Without DMA, using programmed input/output (PIO) mode for communication with peripheral devices, or load/store instructions in the case of multi-core chips, the CPU is typically fully occupied for the entire duration of the read or write operation, and is thus unavailable to perform other work. With DMA, the CPU would initiate the transfer, do other operations while the transfer is in progress, and receive an interrupt from the DMA controller once the operation has been done. This is especially useful in real-time computing applications where not stalling behind concurrent operations is critical.

Figure 3:
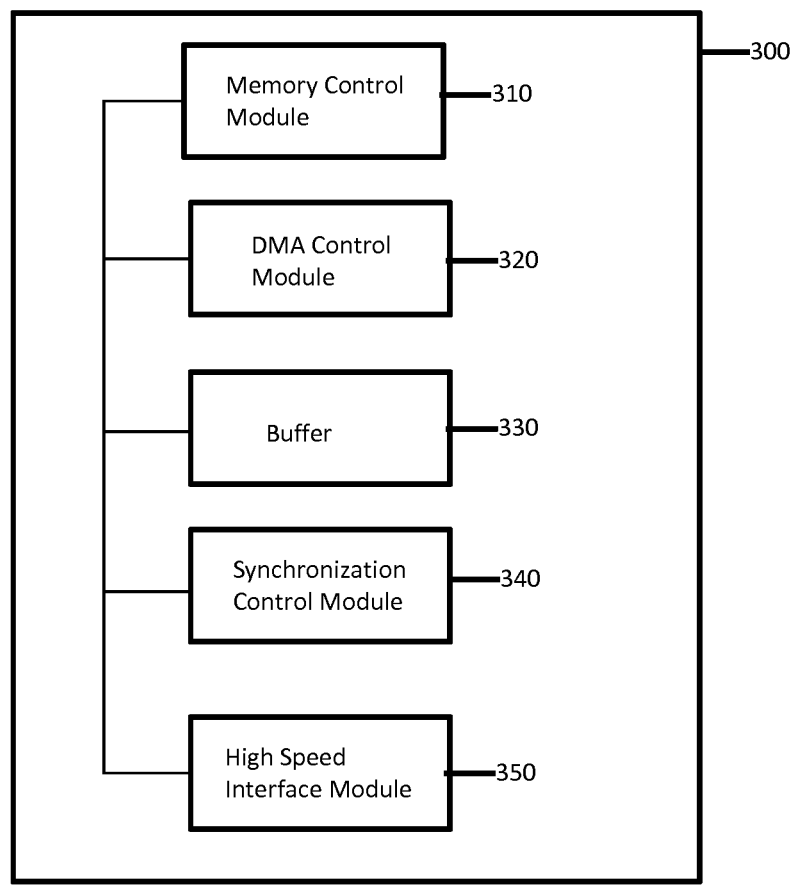
FIG. 3 is a diagram illustrating a configuration of a controller unit in FIG. 1 according to an embodiment of the present invention.

Referring now to FIG. 3, the controller unit 300 of FIG. 1 is shown as comprising: a memory control module 310 which controls data input/output of the SSD memory disk unit 100;

a DMA control module 320 which controls the memory control module 310 to store the data in the SSD memory disk unit 100, or reads data from the SSD memory disk unit 100 to provide the data to the host, according to an instruction from the host received through the PCI-Express host interface unit 200; a buffer 330 which buffers data according to the control of the DMA control module 320; a synchronization control module 340 which, when receiving a data signal corresponding to the data read from the SSD memory disk unit 100 by the control of the DMA control module 320 through the DMA control module 320 and the memory control module 310, adjusts synchronization of a data signal so as to have a communication speed corresponding to a PCI-Express communications protocol to transmit the synchronized data signal to the PCI-Express host interface unit 200, and when receiving a data signal from the host through the PCI-Express host interface unit 200, adjusts synchronization of the data signal so as to have a transmission speed corresponding to a communications protocol (for example, PCI, PCI-x, or PCI-e, and the like) used by the SSD memory disk unit 100 to transmit the synchronized data signal to the SSD memory disk unit 100 through the DMA control module 320 and the memory control module 310; and a high-speed interface module 350 which processes the data transmitted/received between the synchronization control module 340 and the DMA control module 320 at high speed. Here, the high-speed interface module 350 includes a buffer having a double buffer structure and a buffer having a circular queue structure, and processes the data transmitted/received between the synchronization control module 340 and the DMA control module 320 without loss at high speed by buffering the data and adjusting data clocks.

Referring back to FIG. 1, auxiliary power source unit 400 may be configured as a rechargeable battery or the like, so that it is normally charged to maintain a predetermined power using power transferred from the host through the PCI-Express host interface unit 200 and supplies the charged power to the power source control unit 500 according to the control of the power source control unit 500.

The power source control unit 500 supplies the power transferred from the host through the PCI-Express host interface unit 200 to the controller unit 300, the SSD memory disk unit 100, the backup storage unit 600A-B, and the backup control unit 700.

In addition, when an error occurs in a power source of the host because the power transmitted from the host through the PCI-Express host interface unit 200 is blocked, or the power transmitted from the host deviates from a threshold value, the power source control unit 500 receives power from the auxiliary power source unit 400 and supplies the power to the SSD memory disk unit 100 through the controller unit 300.

The backup storage unit 600A-B is configured as a low-speed non-volatile storage device such as a hard disk and stores data of the SSD memory disk unit 100.

The backup control unit 700 backs up data stored in the SSD memory disk unit 100 in the backup storage unit 600A-B by controlling the data input/output of the backup storage unit 600A-B and backs up the data stored in the SSD memory disk unit 100 in the backup storage unit 600A-B according to an instruction from the host, or when an error occurs in the power source of the host due to a deviation of the power transmitted from the host deviates from the threshold value.

The storage device of a serial-attached small computer system interface/serial advanced technology attachment (PCI-Express) type supports a low-speed data processing speed for a host by adjusting synchronization of a data signal transmitted/received between the host and a memory disk during data communications between the host and the memory disk through a PCI-Express interface, and simultaneously supports a high-speed data processing speed for the memory disk, thereby supporting the performance of the memory to enable high-speed data processing in an existing interface environment at the maximum.

While the exemplary embodiments have been shown and described, it will be understood by those skilled in the art that various changes in form and details may be made thereto without departing from the spirit and scope of this disclosure as defined by the appended claims. In addition, many modifications can be made to adapt a particular situation or material to the teachings of this disclosure without departing from the essential scope thereof. Therefore, it is intended that this disclosure not be limited to the particular exemplary embodiments disclosed as the best mode contemplated for carrying out this disclosure, but that this disclosure will include all embodiments falling within the scope of the appended claims.

The foregoing description of various aspects of the invention has been presented for purposes of illustration and description. It is not intended to be exhaustive or to limit the invention to the precise form disclosed and, obviously, many modifications and variations are possible. Such modifications and variations that may be apparent to a person skilled in the art are intended to be included within the scope of the invention as defined by the accompanying claims.

What is claimed is:

1. A system for secure error detection and synchronous data tagging for high-speed data transfer, comprising:
 a device driver being configured generating a first encoded communication stream, the first encoded communication stream comprising a first tag having an error detection code (EDC), a data portion, and a second tag having a data protection code (DPC), wherein the EDC is encoded before the DPC is encoded; and
 a semiconductor storage device (SSD) memory disk unit being configured to receive and decode the first encoded communication stream.

2. The system of claim 1, the device driver comprising:
 an EDC encoder for encoding the first tag of the first encoded communication stream;
 a DPC encoder coupled to the EDC encoder for encoding the second tag of the first encoded communication stream; and
 a first physical interface coupled to the DPC encoder for transmitting the first encoded communication stream.

3. The system of claim 2, the SSD memory disk unit comprising:
 a first host interface for receiving the first encoded communication stream from the physical interface;
 a data synchronizer coupled to the host interface for synchronizing the data portion of the first encoded communication stream;
 a DPC decoder coupled to the data synchronizer for decoding the second tag of the first encoded communication stream; and
 an EDC decoder coupled to the DPC decoder for decoding the first tag of the first encoded communication stream.

4. The system of claim 3, the SSD memory disk unit being further configured to generate a second encoded communication stream, the second encoded communication stream comprising:
 a first tag having an error detection code (EDC);
 a data portion; and
 a second tag having a data protection code (DPC).

5. The system of claim 4, the SSD memory disk unit further comprising:

a host interface controller coupled to the EDC decoder;
an EDC encoder coupled to the host interface controller for encoding the first tag of the second encoded communication stream; and
a DPC encoder coupled to the EDC encoder for encoding the second tag of the second encoded communication stream; and
a second host interface coupled to the DPC encoder for transmitting the second encoded data stream to the device driver.

6. The system of claim 5, the device driver being further configured to receive the second encoded communication stream, the device driver further comprising:
a second physical interface for receiving the second encoded communication stream from the second host interface;
a data synchronizer coupled to the second physical interface;
a DPC decoder coupled to the data synchronizer for decoding the second tag of the second encoded communication stream; and
an EDC decoder coupled to the DPC decoder for decoding the first tag of the second encoded communication stream.

7. The system of claim 1, the first encoded communication stream and the second encoded communication stream being communicated via a PCI-based channel.

8. The system of claim 1, the DPC comprising a set of data and the EDC.

9. A system for secure error detection and synchronous data tagging for high-speed data transfer, comprising:
a device driver being configured to generate a first encoded communication stream, the device driver comprising:
an error detection code (EDC) encoder for encoding a first tag of the first encoded communication stream having an error detection code (FDC);
a data protection code (DPC) encoder coupled to the EDC encoder for encoding a second tag of the first encoded communication stream having a data protection code (DPC), wherein the EDC is encoded before the DPC is encoded;
a first physical interface coupled to the DPC encoder for transmitting the first encoded communication stream;
a semiconductor storage device (SSD) memory disk unit being configured to receive the first encoded communication stream from the device driver comprising:
a first host interface for receiving the first encoded communication stream from the physical interface;
a data synchronizer coupled to the host interface for synchronizing data in the first encoded communication stream;
a DPC decoder coupled to the data synchronizer for decoding the second tag; and
an EDC decoder coupled to the DPC decoder for decoding the first tag.

10. The system of claim 9, the SSD memory disk unit being further configured to generate a second encoded communication stream, the second encoded communication stream comprising:
a first tag having an error detection code (EDC);
a data portion; and
a second tag having a data protection code (DPC).

11. The system of claim 10, the SSD memory disk unit further comprising:
a host interface controller coupled to the EDC decoder;
an EDC encoder coupled to the host interface controller for encoding the first tag of the second encoded communication stream;
a DPC encoder coupled to the EDC encoder for encoding the second tag of the second encoded communication stream; and
a second host interface coupled to the DPC encoder for transmitting the second encoded data stream to the device driver.

12. The system of claim 11, the device driver being further configured to receive the second encoded communication stream, the device driver further comprising:
a second physical interface for receiving the second encoded communication stream from the second host interface;
a data synchronizer coupled to the second physical interface;
an EDC decoder coupled to the data synchronizer for decoding the first tag of the second encoded communication stream; and
a DPC decoder coupled to the EDC decoder for decoding the second tag of the second encoded communication stream.

13. A method for providing error detection and synchronous data tagging for high speed data transfer, comprising:
generating a first encoded communication stream with a device driver, the first encoded communication stream comprising a first tag having an error detection code (EDC), a data portion, and a second tag having a data protection code (DPC), wherein the EDC is encoded before the DPC is encoded;
receiving the first encoded communication stream on a semiconductor storage device (SSD) memory disk unit; and
decoding the first encoded communication stream on the SSD memory disk unit.

14. The method of claim 13, further comprising providing the device driver by:
providing an EDC encoder for encoding the first tag of the first encoded communication stream;
coupling a DPC encoder to the EDC encoder for encoding the second tag of the first encoded communication stream; and
coupling a first physical interface to the DPC encoder for transmitting the first encoded communication stream.

15. The method of claim 14, further comprising providing the SSD memory disk unit by:
providing a first host interface for receiving the first encoded communication stream from the physical interface;
coupling a data synchronizer to the host interface for synchronizing the data portion of the first encoded communication stream;
coupling a DPC decoder to the data synchronizer for decoding the second tag of the first encoded communication stream; and
coupling an EDC decoder to the DPC decoder for decoding the first tag of the first encoded communication stream.

16. The method of claim 15, further comprising generating a second encoded communication stream with the SSD memory disk unit, the second encoded communication stream comprising:
a first tag having an error detection code (EDC);
a data portion; and
a second tag having a data protection code (DPC).

17. The method of claim 16, the providing of the SSD memory disk unit further comprising:

coupling a host interface controller to the EDC decoder;
coupling an EDC encoder to the host interface controller for encoding the first tag of the second encoded communication stream;
coupling a DPC encoder to the EDC encoder for encoding the second tag of the second encoded communication stream; and
coupling a second host interface to the DPC encoder for transmitting the second encoded data stream to the device driver.

18. The method of claim 17, further comprising receiving the second encoded communication stream on the device driver, the providing of the device driver further comprising:
providing a second physical interface for receiving the second encoded communication stream from the second host interface;
coupling a data synchronizer to the second physical interface;
coupling a DPC decoder to the data synchronizer for decoding the second tag of the second encoded communication stream; and
coupling an EDC decoder to the DPC decoder for decoding the first tag of the second encoded communication stream.

19. The method of claim 13, further comprising communicating the first encoded communication stream and the second encoded communication stream via a PCI-based channel.

20. The method of claim 13, the DPC comprising a set of data and the EDC.

* * * * *